United States Patent [19]

Reynolds

[11] 3,751,799

[45] Aug. 14, 1973

[54] SOLDER TERMINAL REWORK TECHNIQUE

[75] Inventor: Jerald James Reynolds, Swanton, Vt.

[73] Assignee: International Business Machines Corporation, Armonk, N.Y.

[22] Filed: Apr. 26, 1972

[21] Appl. No.: 247,613

[52] U.S. Cl. ........................ 29/574, 29/575, 29/577, 29/401

[51] Int. Cl. ........................ B01j 17/00

[58] Field of Search ........................ 29/574, 575, 577, 29/401, 492, 626

[56] References Cited

UNITED STATES PATENTS

| | | | |
|---|---|---|---|
| 3,561,107 | 2/1971 | Best et al. | 29/577 |
| 3,618,201 | 11/1971 | Makimoto et al. | 29/574 |

OTHER PUBLICATIONS

IBM Technical Disclosure Bulletin – Vol. 10, No. 11 April 1968, page 1,810, Spielman et al.

IBM Tech. Bulletin – Vol. 13, No. 7, Dec. 1970, pp. 1,811 & 1,812 – Beliveau et al.

*Primary Examiner*—Charles W. Lanham
*Assistant Examiner*—W. Tupman
*Attorney*—J. Jancin Jr. and Stephen J. Limanek

[57] ABSTRACT

Excess solder is removed from contact elements to which a semiconductor device or integrated circuit chip is to be bonded on a multiple chip carrying substrate, without damaging chips solder bonded to adjacent contact elements. Typically, a chip not functioning according to test specifications is removed by reflowing its solder bonds in a carefully controlled heat cycle, then lifting it from the contact elements. The present process removes excess solder left behind by the removed chip. A layer of solderable metal is deposited on a member essentially duplicating the heat transfer characteristics of the chip. The excess solder is contacted with the solderable metal layer. The excess solder is heated to reflow temperatures in a heat cycle duplicating that used for reflowing the solder bond. The member simulating the chip is then removed, carrying with it the excess solder and restoring the contact elements to proper condition for receiving a replacement chip, without damage to adjacent chips.

10 Claims, 5 Drawing Figures

SOLDER TERMINAL REWORK TECHNIQUE

FIELD OF THE INVENTION

This invention relates to a process for removing excess solder from closely spaced contact elements in solder rework operations. More particularly, it relates to such a process in which excess solder can be removed from closely spaced contact elements in the replacement of semiconductor device and integrated circuit chips not operating according to test specifications, without causing damage to adjacent chips.

DESCRIPTION OF THE PRIOR ART

The necessity to remove excess solder in solder rework operations has long been recognized. The state of the art in this area is reviewed by Manko, *Solders and Soldering*, (1964) pages 296–297. The techniques disclosed there have not been found suitable for use in removing excess solder from closely spaced contact elements on substrates containing a plurality of integrated circuits, primarily due to the necessity to avoid damage to integrated circuit chips placed adjacent to contact elements requiring removal of excess solder.

A solder terminal rework technique directed to the semiconductor chip art is disclosed by Chiou et al., IBM Technical Disclosure Bulletin, March 1970, page 1,666. While the technique disclosed there can be employed under carefully controlled conditions, two factors presently limit its application in an integrated circuit manufacturing environment. The heat conducting disc of copper or nickel employed in that process can be rendered significantly wettable by solder only with great difficulty. Secondly, such a disc has quite different heat transfer properties than a semiconductor chip. A different and precisely controlled heat cycle must therefore be applied with it than is utilized for removal or solder reflow bonding of a semiconductor chip to a substrate.

SUMMARY OF THE INVENTION

Accordingly, it is an object of the invention to provide a process for removing excess solder from a semiconductor device or integrated circuit chip contact site without damage to chips mounted on adjacent contact sites.

It is another object of this invention to enable a controlled heating cycle used to remove an integrated circuit chip from a substrate without damage to adjacent chips also to be used for removal of excess solder from contact elements to which the chip was solder bonded.

It is yet another object of the invention to allow removal of excess solder from contact elements to which an integrated circuit chip is to be solder reflow bonded without reflowing solder bonds joining an adjacent chip to similar contact elements.

It is a further object of the invention to provide a process in which integrated circuit chips not functioning accordingly to specifications are removed from a substrate having other integrated circuit chips mounted on it, excess solder is removed from the site formerly having the removed chip on it, and another chip is mounted on the site, all under volume manufacturing conditions, and without damaging chips mounted on adjacent sites.

These and related objects may be attained through use of the process of this invention. The process removes excess solder from contact elements to which a semiconductor device or integrated circuit chip is to be bonded without damage to adjacent chips. To carry out the process, a layer of solderable metal is deposited on a chip simulating member which essentially duplicates the heat transfer characteristics (i.e., emmissivity and thermal conductivity) of the chip. The excess solder is then contacted with the solderable metal layer and the excess solder is heated to reflow temperatures in a heat cycle within limits established for bonding a chip to the substrate without causing damage to adjacent chips, and preferably without reflowing solder bonds joining adjacent chips to similar contact elements. Removal of the member simulating the chip while the excess solder is still at reflow temperature removes the excess solder which has adhered to the chip simulating member. Because the chip simulating member essentially duplicates the heat transfer characteristics of an actual chip, heating cycles used for the actual chip may be employed for the chip simulating member without risk of damaging chips adjacent to the contacts from which excess solder is being removed. To assure that damage is not caused to adjacent chips, it is preferred that the heating cycle for reflowing the excess solder to allow its removal be insufficient to reflow solder bonding adjacent chips to their contact elements.

The process may be carried out with either discrete semiconductor device chips or with integrated circuit chips. It is especially adapted for use with integrated circuit chips having a substantial number of contact pads to be flip chip solder reflow bonded to corresponding contact elements on, for example, an alumina substrate. In the case of the usual silicon integrated circuit chips, the member simulating the chip may be either silicon or titanium, which also essentially duplicates the heat transfer characteristics of a silicon chip.

While essentially any solderable metal may be deposited on such a silicon or titanium member, the preferred solderable metal layer is copper overlaid with gold. The copper may be conveniently deposited by sputtering or vacuum evaporation, and the gold by electroless plating, electroplating, or vacuum evaporation.

The above process may be incorporated in a process for packaging integrated circuit chips on a substrate. In such a process, integrated circuit chips are first solder reflow bonded to contact elements on the substrate. The integrated circuit chips on the substrate are then tested, usually by the application of DC, AC or both test signals to them. In the case of a substrate containing, for example, 20 or more integrated circuit chips, one or more of the chips will probably not perform in accordance with the test specifications after bonding, either due to defective bonding or to a defect in the chip itself. The solder bonds of a chip not performing in accordance with test specifications are reflowed and the chip is removed from the substrate. At this point, the excess solder removed process described above is carried out to restore the contact elements to which the chip was bonded to a virgin like condition. The removed chip is then replaced with another integrated circuit chip.

The foregoing and other objects, features and advantages of the invention will be apparent from the following more particular description of a preferred embodiment of the invention, as illustrated in the accompanying drawing.

DESCRIPTION OF THE PREFERRED EMBODIMENT

Figure 1:
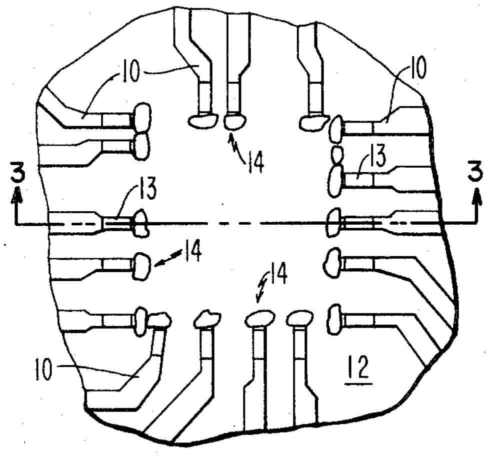
FIG. 1 is a plan view of integrated circuit chip contact elements prior to removal of excess solder in accordance with the invention.

Turning now to the drawings, more particularly to FIG. 1, there is shown a plurality of chip contacting elements 10 on alumina substrate 12. As shown in FIG. 1, the contact elements 10 are substantially enlarged. An actual typical integrated circuit chip measures about 0.1 inch by 0.1 inch. In practice, the integrated circuit chip contact elements 10 are provided on substrate 12 by screening a solder wettable conductive pattern 11, typically a silver-palladium paste (seen in cross section in FIGS. 3–5) on the substrate 12 in a known manner, depositing a glass dam 13 on the conductive pattern also in a known manner, then contacting the substrate 12 with molten solder, thus forming the contact elements 10, with solder lands 14 defined by glass dams 13 in a substantially hemispherical shape, as best shown in FIGS. 2 and 5.

Figure 2:
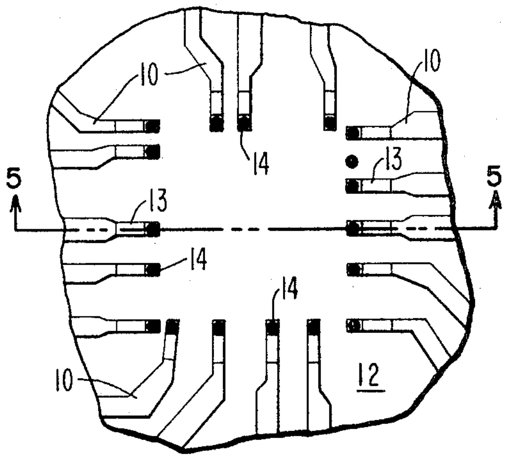
FIG. 2 is a plan view of the contact elements in FIG. 1, but after removal of excess solder in accordance with the invention.
Figure 5:
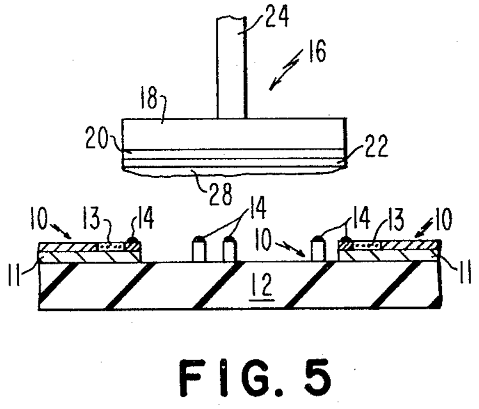
FIG. 5 is a cross section view similar to FIGS. 3 and 4, taken along the line 5—5 in FIG. 2 and showing the chip simulation member after removal of excess solder in accordance with the invention.

As originally produced, the solder lands 14 of contact elements 10 have a clean, substantially hemispherical shape, as shown in FIGS. 2 and 5. In use, a semiconductor chip is positioned over solder lands 14 with its solder pads in registration with the lands 14. A heat cycle is then employed to reflow the solder on the pads and on the lands 14 to bond the chips to the contact elements 10.

If the chip is improperly bonded to contact elements 10, or if the chip itself is defective in some manner, subsequent testing of it will reveal its inoperative state. If the chip is inoperative, it is desired to remove it from contact elements 10 and replace it with another chip. This is most conveniently done using apparatus of the type disclosed in commonly assigned Ward, U.S. Pat. application Ser. No. 139,063, filed Apr. 30, 1971, the disclosure of which is incorporated by reference herein. In that apparatus, a non-functioning chip is heated sufficiently by a microflame to reflow its solder bonds. To prevent damage to chips mounted on adjacent contact elements, the apparatus there disclosed senses the temperature of the chip to be removed by infrared sensing means, discontinues heating by extinguishing the microflame and picks up the chip to remove it from the contact elements 10. Due to retention of solder from solder pads on the chip, excess solder, shown best in FIGS. 1 and 3, remains behind on solder lands 14, giving solder lands 14 an irregular shape. In some cases, sufficient excess solder is left behind on lands 14 to join two elements 10 physically, thus short circuiting them. Even if short circuiting does not occur prior to bonding a replacement chip to elements 10, short circuiting often occurs due to excess solder when a replacement chip is reflow bonded to the elements 10.

Figure 3:
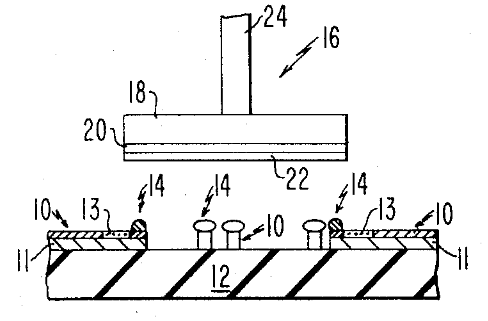
FIG. 3 is a cross section taken along the line 3—3 in FIG. 1, and also showing a chip simulation member prior to removal of excess solder in accordance with the invention.

Shown in FIG. 3 is a chip simulation member 16 prior to its use in practicing the invention. Member 16 includes a chip 18 of silicon of the same dimensions as an integrated circuit chip. Alternatively, since the heat transfer properties of titanium are quite close to those of silicon, the silicon chip 18 could be titanium. To provide a solder wettable surface, a layer 20 of copper is sputtered on the silicon chip 18 to a thickness of approximately 3 microns to 0.0008 inch. A layer 22 of gold in a thickness of 1,000–15,000 Angstroms is then electrolessly plated on copper layer 20. Alternatively, a solder wettable layer can be provided on silicon chip 18 by vacuum evaporation of about 1,500 Angstroms of chromium, about 500 Angstroms of a chromium-copper mixture, about 10,000 Angstroms of copper, and about 1,500 Angstroms of gold.

Figure 4:
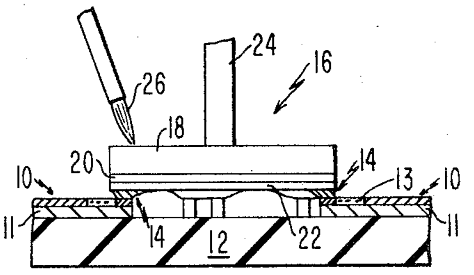
FIG. 4 is a cross section similar to FIG. 3, but showing a chip simulation member in place for excess solder removal and after solder reflow has occurred.

In use for removing excess solder from solder lands 14, the chip simulating member 16 is held by vacuum pencil 24 and positioned over solder lands 14. The chip simultating member 16 is then lowered to contact elements 10, and the solder lands 14 are heated to reflow temperature, through use of a microflame 26, as shown in FIG. 4. Chip simulating member 16 is heated by microflame 26 within the limits established for reflow bonding a chip to contact elements 10 or removing a chip from contact elements 10, in order to prevent damage to chips mounted on adjacent contact elements. In practice, these limits are set by making certain that enough heat is supplied to reflow solder lands 14 where the desired operation is carried out without reflowing the solder bonds of adjacent chips. The amount of heating supplied by microflame 26 may be conveniently measured and controlled through use of an infrared sensing means (not shown), as set forth in the above referenced Ward application. As the excess solder melts, it flows onto and adheres to gold layer 22 on chip simulating member 16.

When solder reflow has taken place, microflame 26 is extinguished and chip simulating member 16 is raised by vacuum pencil 24 from contact elements 10, as shown in FIG. 5. Excess solder 28 adheres to chip simulating member 16, thus restoring contact elements 10 to their original condition with solder lands 14 having a regular, hemispherical shape.

In operation, utilizing the Ward apparatus, the removal of excess solder in accordance with this invention can be accomplished in about one second under manufacturing conditions, giving results as shown by a comparison of FIGS. 1 and 2. It should be recognized that FIGS. 1 and 2 are drawings taken from photographs of actual integrated circuit contact elements before and after removal of excess solder in a single use of the above process. Should some excess solder remain on solder lands 14 after a single use of the process, it may conveniently be repeated one or more times to assure complete removal of all excess solder, but this is not usually necessary.

It should now be apparent that a process for removal of excess solder capable of carrying out the stated objects of the invention has been provided. The process allows removal of all excess solder rapidly and without damage to adjacent semiconductor devices or integrated circuit chips. Use of this process allows reliable removal and replacement of nonfunctioning chips on substrates carrying a plurality of chips under volume integrated circuit manufacturing conditions.

While the invention has been particularly shown and described with reference to a preferred embodiment thereof, it will be understood by those skilled in the art that various changes in form and detail may be made therein without departing from the spirit and scope of the invention.

What is claimed is:

1. A process for removing excess solder from contact elements to which a semiconductor chip is to be bonded, comprising:

A. depositing a layer of solderable metal on a member essentially duplicating the heat transfer characteristics of the chip, B. contacting the excess solder with the solderable metal layer, C. heating the excess solder to reflow temperature in a heat cycle within limits established for preventing damage to adjacent chips, and D. removing the member simulating the chip.

2. The process of claim 1 in which the chip is an integrated circuit silicon chip and the member simulating the chip is silicon or titanium.

3. The process of claim 2 in which the solderable metal is copper overlaid with gold.

4. The process of claim 3 in which the copper is deposited by sputtering and the gold is deposited by plating.

5. The process of claim 3 in which the copper and gold are applied by vacuum evaporation.

6. The process of claim 1 in which the heat cycle supplies an amount of heat insufficient to cause reflow of solder bonds of an adjacent semiconductor chip.

7. A process for packaging integrated circuit chips on a substrate, comprising:

A. solder reflow bonding the chips to contact elements on the substrate,

B. testing the integrated circuit chips on the substrate,

C. reflowing the solder bonds of a chip not performing in accordance with the test specifications and removing it, D. removing excess solder from contact elements from which the chip has been removed by:

1. depositing solderable metal on a member simulating an integrated circuit chip,
2. contacting the excess solder with the solderable metal,
3. heating the excess solder to reflow temperature in a heat cycle within limits necessary to prevent damage to adjacent chips, and
4. removing the member simulating the chip, and E. replacing the removed chip with another integrated circuit chip.

8. The process of claim 7 in which the integrated circuit chips are silicon, and the member simulating a chip is silicon or titanium.

9. The process of claim 8 in which the solderable metal is copper overlaid with gold.

10. The process of claim 7 in which heat cycles used in solder reflow removal of a chip not performing in accordance with test specifications, in removal of the excess solder, and in replacement of the removed chip with another integrated circuit chip all supply an amount of heat insufficient to cause reflow of solder bonds of an adjacent integrated circuit chip.

* * * * *